United States Patent
Mahmoud et al.

(10) Patent No.: US 10,666,136 B2
(45) Date of Patent: May 26, 2020

(54) TWO DIMENSIONAL CHARGE PUMP

(71) Applicant: Khalifa University of Science and Technology, Abu Dhabi (AE)

(72) Inventors: Abdulqader Nael Mahmoud, Abu Dhabi (AE); Mohammad Radwan Alhawari, Abu Dhabi (AE); Baker Mohammad, Austin, TX (US); Hani Hasan Mustafa Saleh, Round Rock, TX (US); Mohammed Ismail Elnaggar, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 9 days.

(21) Appl. No.: 16/102,925

(22) Filed: Aug. 14, 2018

(65) Prior Publication Data
US 2019/0081560 A1    Mar. 14, 2019

Related U.S. Application Data

(60) Provisional application No. 62/556,679, filed on Sep. 11, 2017.

(51) Int. Cl.
H02M 3/07    (2006.01)
H03L 7/089   (2006.01)
H02M 1/00    (2006.01)

(52) U.S. Cl.
CPC ............ *H02M 3/07* (2013.01); *H03L 7/0895* (2013.01); *H02M 2001/009* (2013.01);
(Continued)

(58) Field of Classification Search
CPC .. G06F 16/24578; G06F 16/20; G06F 16/245; G06F 16/24
(Continued)

(56) References Cited

U.S. PATENT DOCUMENTS

2008/0150620 A1*  6/2008  Lesso ............... H02M 3/07
                                                 327/536
2011/0204959 A1*  8/2011  Sousa ............... H02M 3/07
                                                 327/536
(Continued)

OTHER PUBLICATIONS

Cabrini, A., et al., "Theoretical and Experimental Analysis of Dickson Charge Pump Output Resistance," Proceedings of the 2006 IEEE International Symposium on Circuits and Systems, May 21-24, 2006, Island of Kos, Greece, pp. 2749-2752.

Dickson, J. F., et al., "On-Chip High-Voltage Generation in MNOS Integrated Circuits Using an Improved Voltage Multiplier Technique," IEEE Journal of Solid-State Circuits, vol. 11, Issue 3, Jun. 1976, pp. 374-378.

Forrest, S. R., "The Limits to Organic Photovoltaic Cell Efficiency," MRS Bulletin, vol. 30, Jan. 2005, pp. 28-32.
(Continued)

*Primary Examiner* — Ryan Jager
(74) *Attorney, Agent, or Firm* — Withrow & Terranove, P.L.L.C.

(57) ABSTRACT

A two dimensional charge pump and control circuitry is disclosed. The two dimensional charge pump includes a group of parallel-coupled charge pumps coupled between a DC power source and a first output connection node via a corresponding group of charge pump connection nodes. The group of parallel-coupled charge pumps has a corresponding group of clock connection nodes. Each of the group of parallel-coupled charge pumps includes a corresponding group of series capacitive elements coupled between a corresponding one of the group of charge pump connection nodes and a corresponding one of the group of clock connection nodes.

17 Claims, 16 Drawing Sheets

(52) U.S. Cl.
 CPC ............... *H02M 2001/0041* (2013.01); *H02M 2003/077* (2013.01); *H03L 7/0891* (2013.01)

(58) Field of Classification Search
 USPC ......................................................... 327/536
 See application file for complete search history.

(56) References Cited

U.S. PATENT DOCUMENTS

| | | | | |
|---|---|---|---|---|
| 2012/0014193 A1* | 1/2012 | Sakurai | ................. | G11C 5/145 365/189.11 |
| 2012/0049936 A1* | 3/2012 | Adkins | .................. | H02M 3/07 327/536 |
| 2013/0015919 A1* | 1/2013 | Kropfitsch | ................ | H03F 1/38 330/260 |
| 2013/0051582 A1* | 2/2013 | Kropfitsch | ................ | H03F 1/56 381/111 |
| 2014/0152379 A1* | 6/2014 | Fujimoto | .............. | H02M 3/073 327/536 |
| 2015/0311786 A1* | 10/2015 | Giuliano | ................. | H02M 3/07 327/536 |

OTHER PUBLICATIONS

Im, J.-P., et al., "A 40 mV Transformer-Reuse Self-Startup Boost Converter With MPPT Control for Thermoelectric Energy Harvesting," Proceedings of the 2012 IEEE International Solid-State Circuits Conference, Feb. 19-23, 2012, San Francisco, California, USA, pp. 104-106.

Mahmoud, A., et al., "A Multi-Input, Multi-Output Power Management Unit Using Dickson Charge Pump for Energy Harvesting Applications," Proceedings of the 2016 IEEE 59th International Midwest Symposium on Circuits and Systems (MWSCAS), Oct. 16-19, 2016, Abu Dhabi, United Arab Emirates, pp. 557-560.

Miftakhutdinov, R., "Analysis and Optimization of Synchronous Buck Converter at High Slew-Rate Current Transients," Proceedings of the 2000 IEEE 31st Annual Power Electronics Specialists Conference, Jun. 23, 2000, Galway, Ireland, pp. 714-720.

Zhang, M. T., et al., "Design Considerations for Low-Voltage On-Board DC/DC Modules for Next Generations of Data Processing Circuits," IEEE Transactions on Power Electronics, vol. 11, No. 2, Mar. 1996, pp. 328-337.

* cited by examiner

TWO DIMENSIONAL CHARGE PUMP

RELATED APPLICATIONS

This application claims the benefit of U.S. Provisional Patent Application Ser. No. 62/556,679 filed Sep. 11, 2017, the disclosure of which is incorporated herein by reference in its entirety.

FIELD OF THE DISCLOSURE

Embodiments of the present disclosure relate to power supplies and charge pumps, which may be used to boost a voltage from a DC power source, such as a battery.

BACKGROUND

In general, DC-DC converters are typically used to either boost or to reduce an input voltage to provide an output voltage. However, a charge pump is one type of DC-DC converter that traditionally uses discrete capacitors and switches to boost the voltage from a DC power source. Since discrete switches are typically used to route DC signals to and from the discrete capacitors, as an output voltage range, an output voltage resolution, or both increase, complexity of the charge pump tends to increase. Further, if multiple output voltages are required, complexity of the charge pump may further increase. Thus, there is a need for a charge pump that provides multiple DC outputs, which are programmable, and increases the output voltage range, the output voltage resolution, or both of each DC output.

SUMMARY

A two dimensional charge pump and control circuitry is disclosed according to one embodiment of the present disclosure. The two dimensional charge pump includes a group of parallel-coupled charge pumps coupled between a DC power source and a first output connection node via a corresponding group of charge pump connection nodes. The group of parallel-coupled charge pumps has a corresponding group of clock connection nodes. Each of the group of parallel-coupled charge pumps includes a corresponding group of series capacitive elements coupled between a corresponding one of the group of charge pump connection nodes and a corresponding one of the group of clock connection nodes.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 shows an electrical apparatus according to the prior art.

FIGS. 2A, 2B, 2C, and 2D are graphs illustrating timing relationships between a clock signal, an inverting clock signal, a beta control signal, and an alpha control signal, respectively, according to the prior art.

FIGS. 2E, 2G, and 2I are graphs illustrating a status of a first alpha switching element, a second alpha switching element, and a third alpha switching element with respect to the alpha control signal, according to the prior art.

Figure 10:
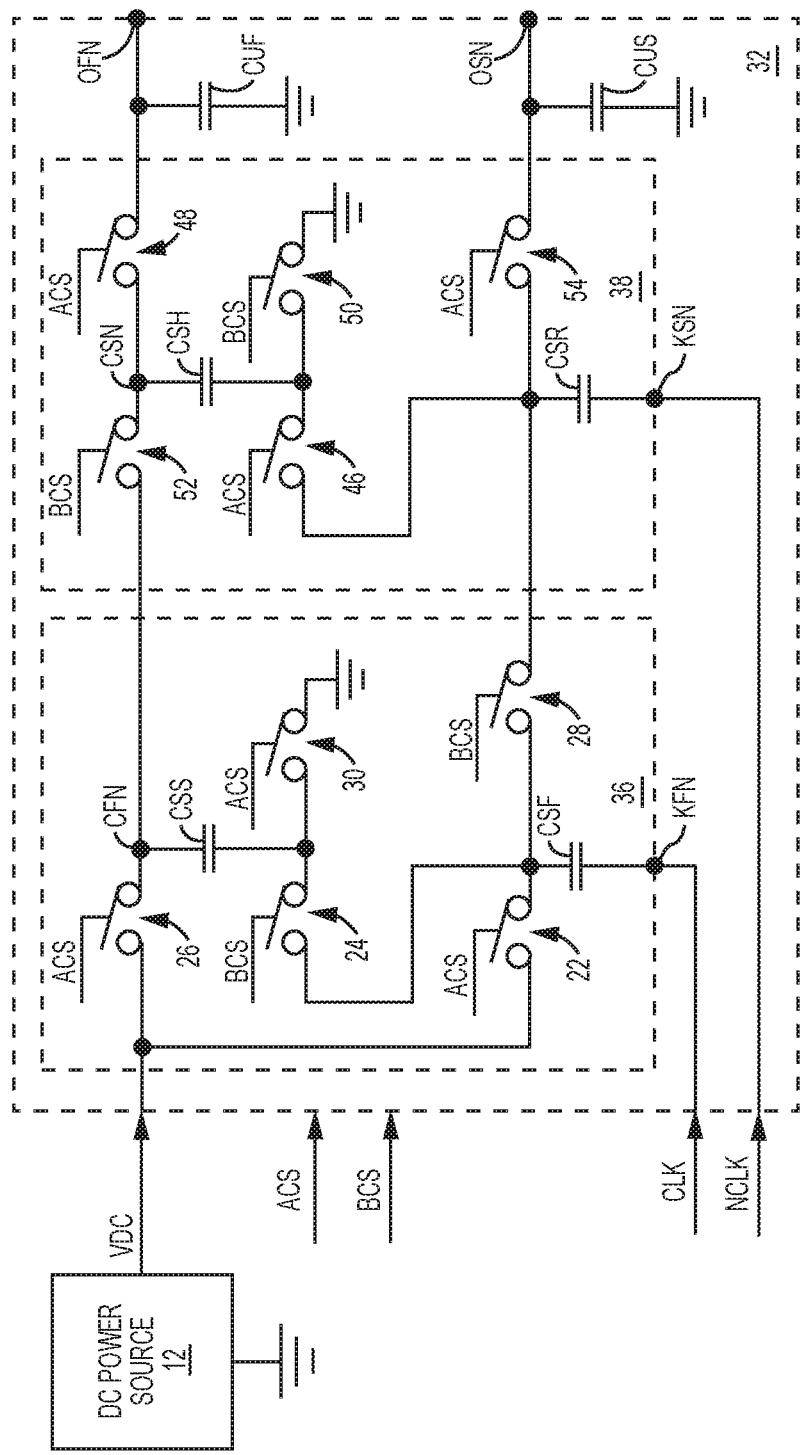
FIG. 10 shows details of the two dimensional charge pump illustrated in FIG. 6 according to an alternate embodiment of the two dimensional charge pump.

FIGS. 11A, 11B, 11C, and 11D are graphs illustrating timing relationships between a clock signal, an inverting clock signal, a beta control signal, and an alpha control signal, respectively, according to one embodiment of the two dimensional charge pump 32 illustrated in FIG. 10.

Figure 11:
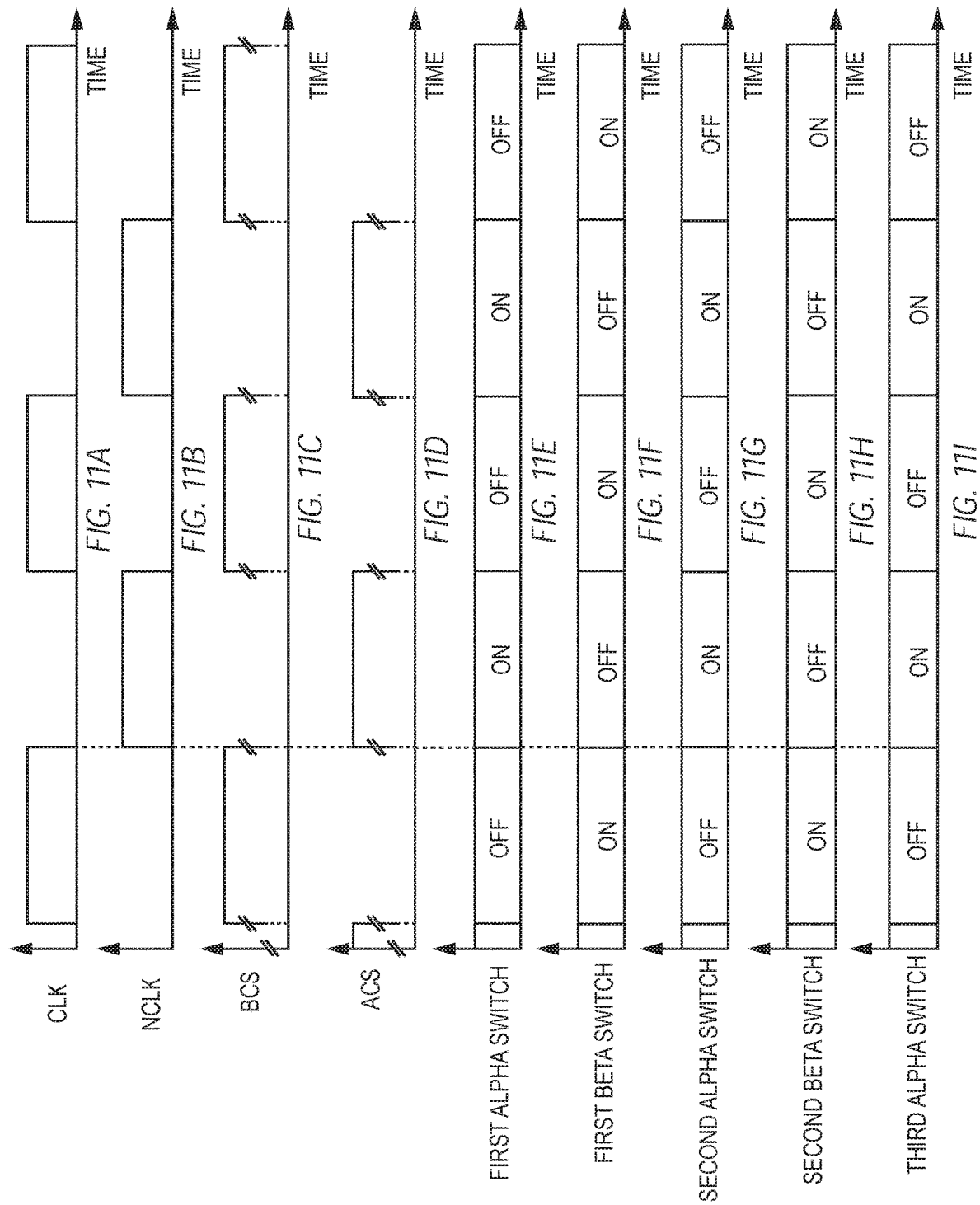

FIGS. 11E, 11G, and 11I are graphs illustrating a status of a first alpha switching element, a second alpha switching element, and a third alpha switching element with respect to the alpha control signal, according to one embodiment of the two dimensional charge pump illustrated in FIG. 10.

FIGS. 11F and 11H are graphs illustrating a status of a first beta switching element and a second beta switching element, respectively, with respect to the beta control signal, according to one embodiment of the two dimensional charge pump illustrated in FIG. 10.

FIGS. 12A, 12B, 12C, and 12D are graphs illustrating timing relationships between the clock signal, the inverting clock signal, the beta control signal, and the alpha control signal, respectively, according to one embodiment of the two dimensional charge pump illustrated in FIG. 10.

Figure 12:
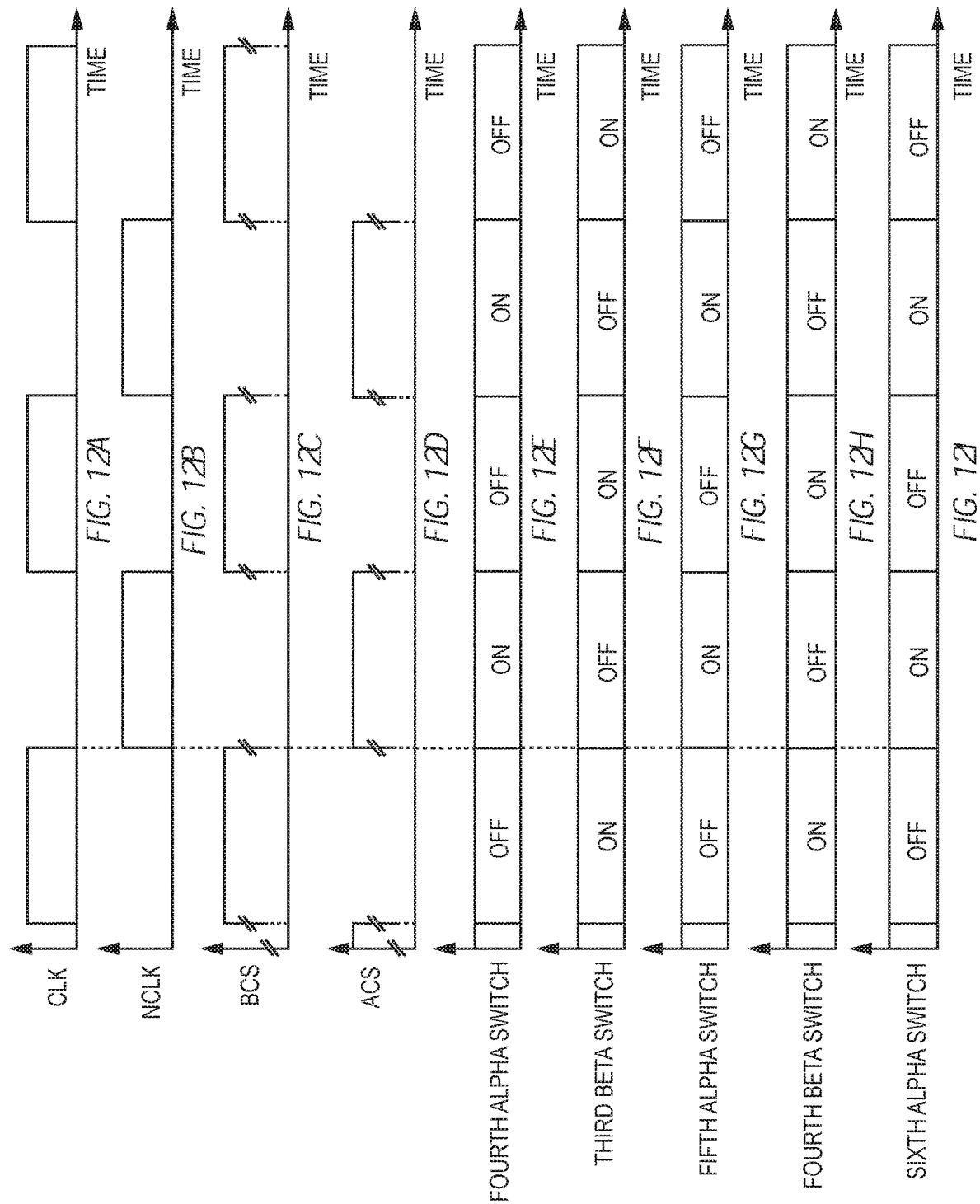

FIGS. 12E, 12G, and 12I are graphs illustrating a status of a fourth alpha switching element, a fifth alpha switching element, and a sixth alpha switching element with respect to the alpha control signal, according to one embodiment of the two dimensional charge pump illustrated in FIG. 10.

FIGS. 12F and 12H are graphs illustrating a status of the third beta switching element and the fourth beta switching element, respectively, with respect to the beta control signal, according to one embodiment of the two dimensional charge pump illustrated in FIG. 10.

Figure 13:
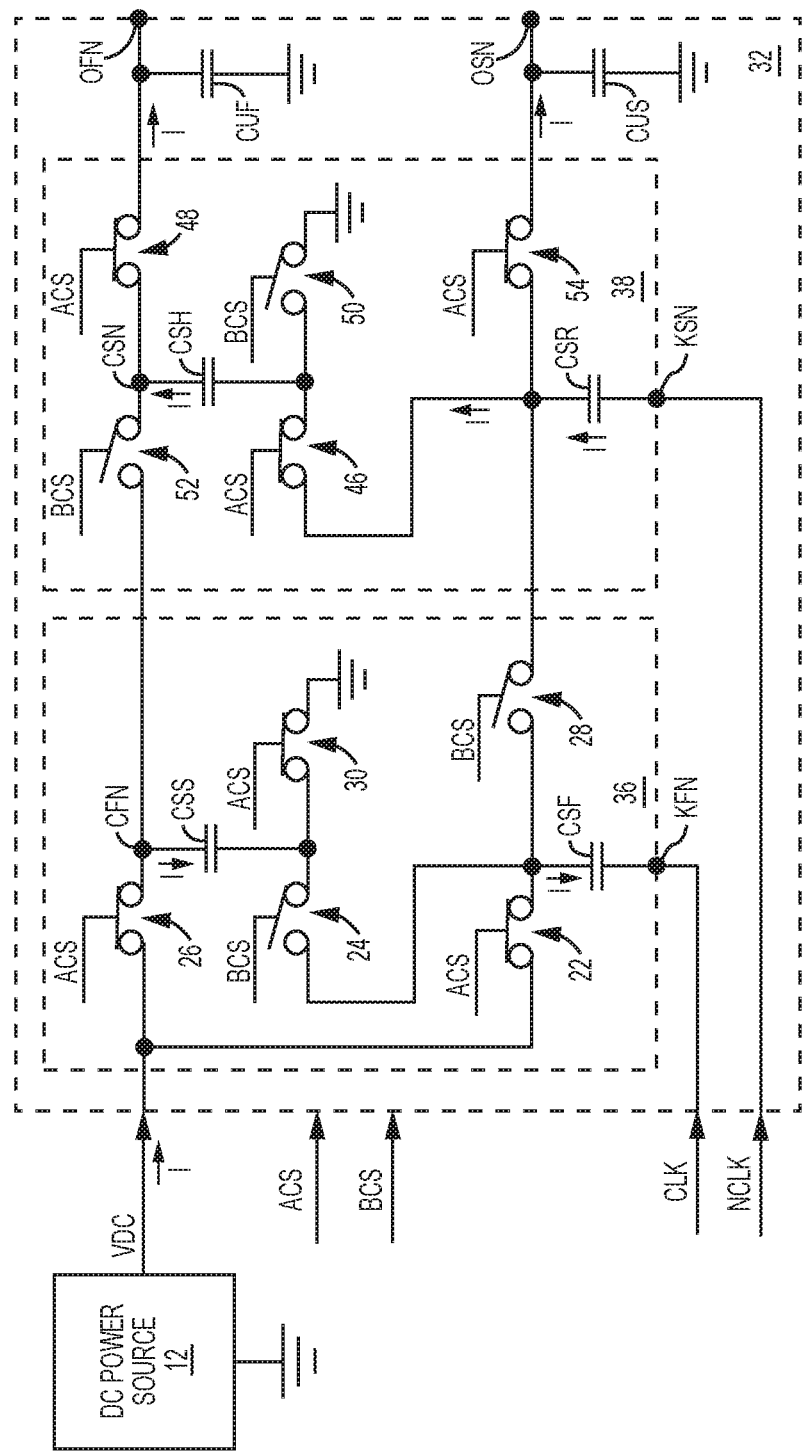

FIG. 13 shows details of the two dimensional charge pump illustrated in FIG. 10 during an alpha operating mode according to one embodiment of the two dimensional charge pump.

Figure 14:
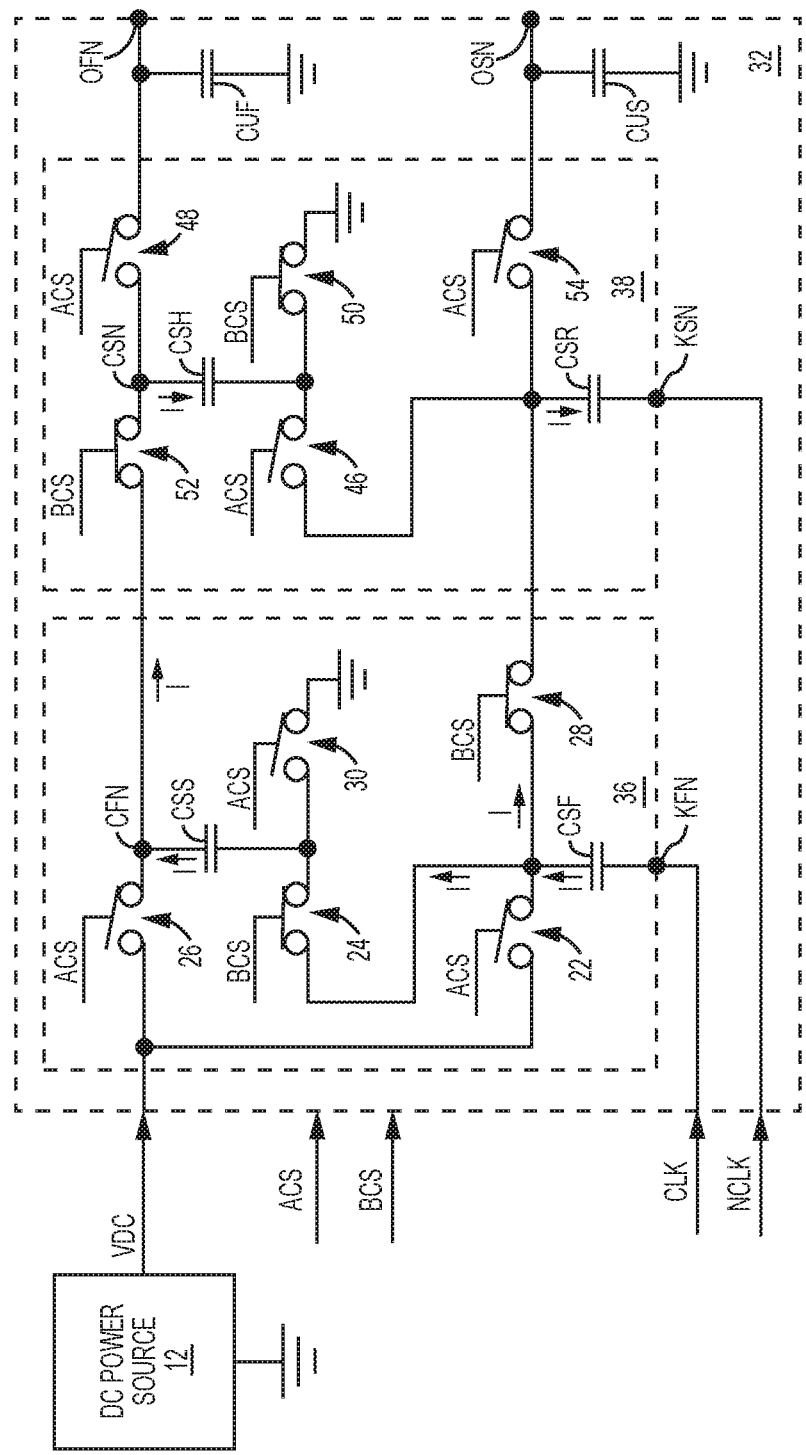

FIG. 14 shows details of the two dimensional charge pump illustrated in FIG. 10 during a beta operating mode according to one embodiment of the two dimensional charge pump.

Figure 6:
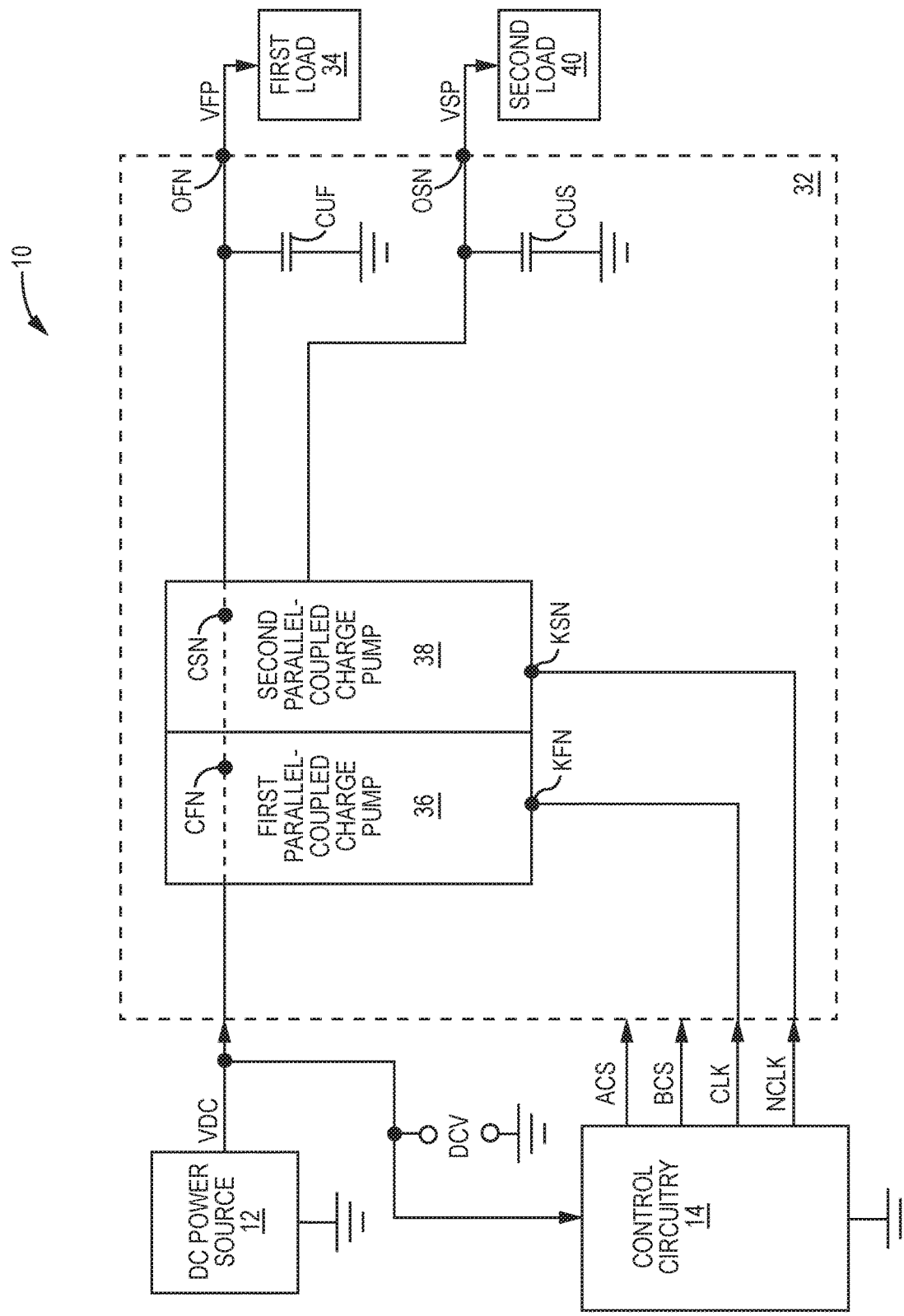
FIG. 6 shows the electrical apparatus according to an alternate embodiment of the electrical apparatus.
Figure 15:
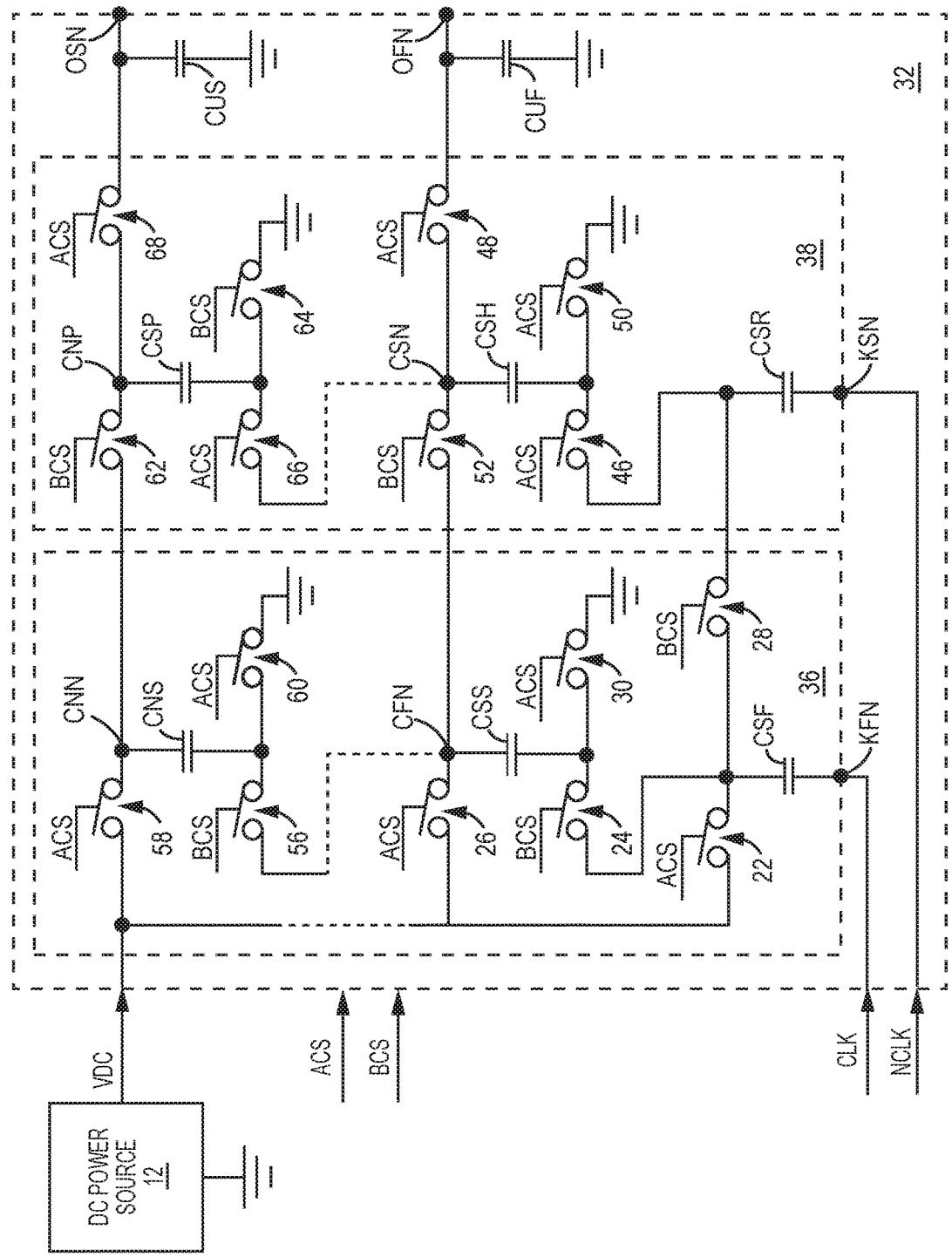

FIG. 15 shows details of the two dimensional charge pump illustrated in FIG. 6 according to one embodiment of the two dimensional charge pump.

Figure 16:
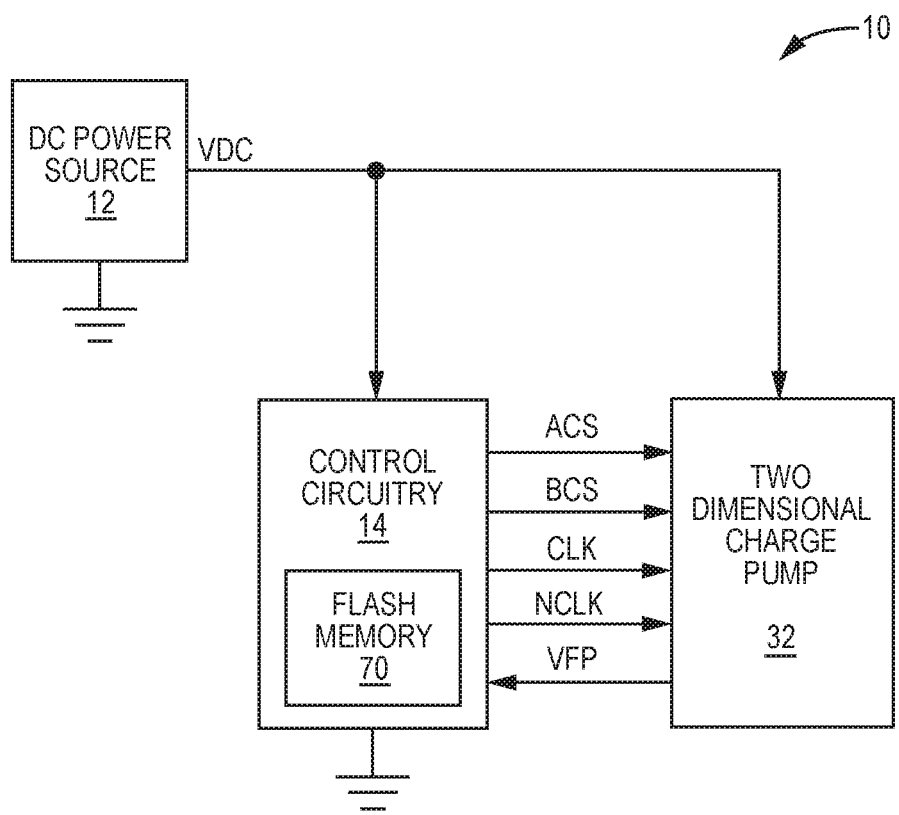

FIG. 16 shows the electrical apparatus according to one embodiment of the electrical apparatus.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

A two dimensional charge pump and control circuitry is disclosed according to one embodiment of the present disclosure. The two dimensional charge pump includes a group of parallel-coupled charge pumps coupled between a DC power source and a first output connection node via a corresponding group of charge pump connection nodes. The group of parallel-coupled charge pumps has a corresponding group of clock connection nodes. Each of the group of parallel-coupled charge pumps includes a corresponding group of series capacitive elements coupled between a corresponding one of the group of charge pump connection nodes and a corresponding one of the group of clock connection nodes.

Figure 1:
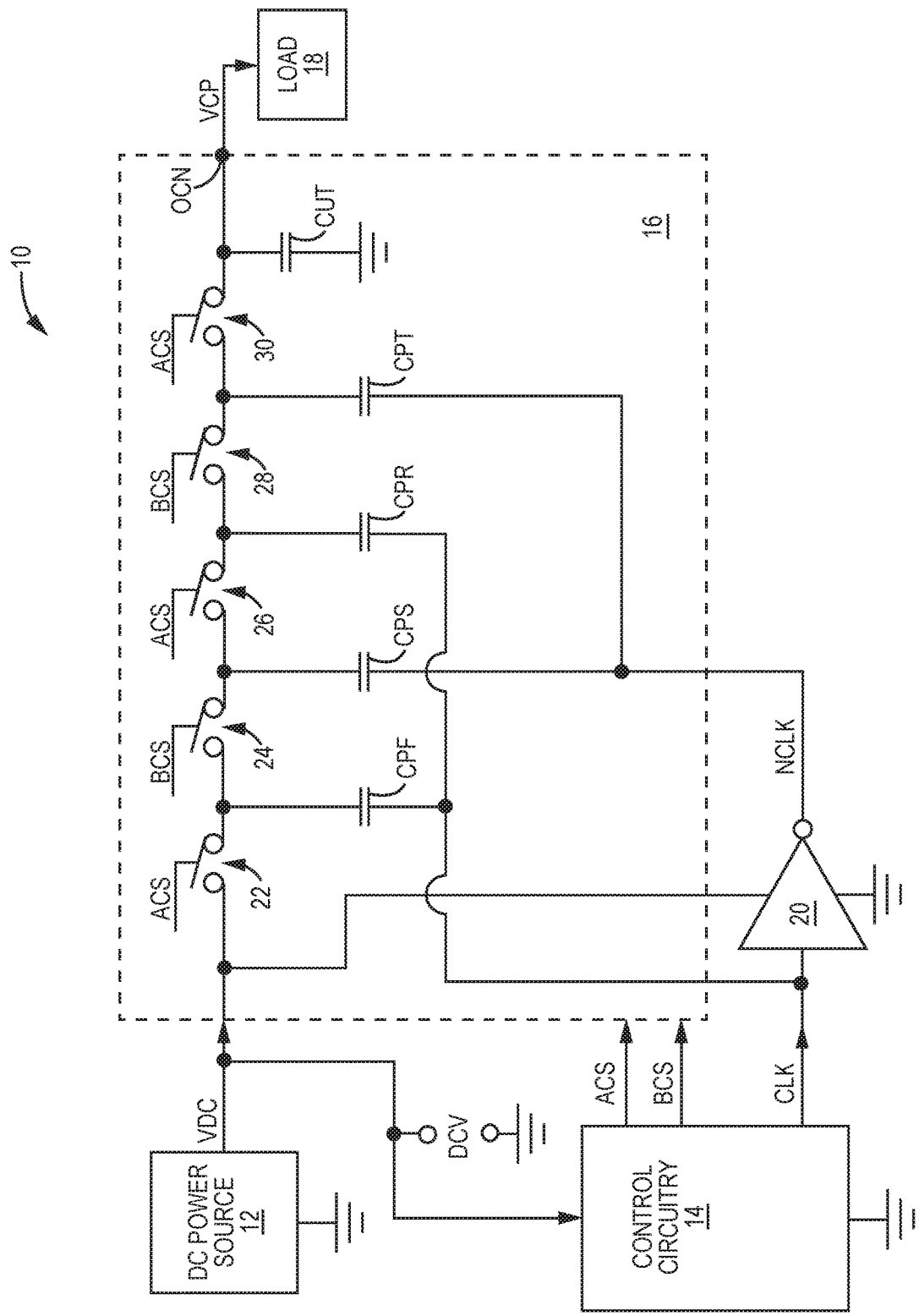

FIG. 1 shows an electrical apparatus 10 according to the prior art. The electrical apparatus 10 includes a DC power source 12, control circuitry 14, a one dimensional charge pump 16, a load 18, and a clock inverter 20. The one dimensional charge pump 16 has an output connection node OCN, which is coupled to the load 18. As such, the one dimensional charge pump 16 provides a charge pump output voltage VCP to the load 18 via the output connection node OCN using a DC source signal VDC. The one dimensional charge pump 16 includes a first alpha switching element 22, a first beta switching element 24, a second alpha switching element 26, a second beta switching element 28, and a third alpha switching element 30 coupled in series between the DC power source 12 and the output connection node OCN. In general, the one dimensional charge pump 16 includes a group of switching elements 22, 24, 26, 28, 30 coupled in series between the DC power source 12 and the output connection node OCN. In this regard, the one dimensional charge pump 16 includes a group of alpha switching elements 22, 26, 30 and a group of beta switching elements 24, 28.

The one dimensional charge pump 16 further includes an output capacitive element CUT coupled between the output connection node OCN and ground. In addition, the one dimensional charge pump 16 further includes a first parallel capacitive element CPF, a second parallel capacitive element CPS, a third parallel capacitive element CPR, and a fourth parallel capacitive element CPT. In general, the one dimensional charge pump 16 includes a group of parallel capacitive elements CPF, CPS, CPR, CPT.

The DC power source 12 provides the DC source signal VDC to the control circuitry 14, the one dimensional charge pump 16, and the clock inverter 20. The DC source signal VDC has a DC source voltage DCV. The control circuitry 14 provides an alpha control signal ACS and a beta control signal BCS to the one dimensional charge pump 16, such that the control circuitry 14 provides the alpha control signal ACS to each of the group of alpha switching elements 22, 26, 30 and the beta control signal BCS to each of the group of beta switching elements 24, 28. In addition, the control circuitry 14 provides a clock signal CLK to the one dimensional charge pump 16 and the clock inverter 20.

The clock inverter 20 inverts the clock signal CLK to provide the inverting clock signal NCLK, such that the inverting clock signal NCLK is phase-shifted from the clock signal CLK by nominally 180 degrees. Therefore, when the clock signal CLK is a logic LOW, the inverting clock signal NCLK is a logic HIGH. When the clock signal CLK is a logic HIGH, the inverting clock signal NCLK is a logic LOW. In this regard, when the clock signal CLK is a logic LOW, a voltage of the clock signal CLK is nominally equal to zero volts, and when the clock signal CLK is a logic HIGH, the voltage of the clock signal CLK is nominally equal to the DC source voltage DCV. Similarly, when the inverting clock signal NCLK is a logic LOW, a voltage of the inverting clock signal NCLK is nominally equal to zero volts, and when the inverting clock signal NCLK is a logic HIGH, the voltage of the inverting clock signal NCLK is nominally equal to the DC source voltage DCV.

The first alpha switching element 22 is coupled between the DC power source 12 and the first beta switching element 24. A first end of the first parallel capacitive element CPF is coupled to the first alpha switching element 22 and the first beta switching element 24. The second alpha switching element 26 is coupled between the first beta switching element 24 and the second beta switching element 28. A first end of the second parallel capacitive element CPS is coupled to the first beta switching element 24 and the second alpha switching element 26.

A first end of the third parallel capacitive element CPR is coupled to the second alpha switching element 26 and the second beta switching element 28. The third alpha switching element 30 is coupled between the second beta switching element 28 and the output connection node OCN. A first end of the fourth parallel capacitive element CPT is coupled to the second beta switching element 28 and the third alpha switching element 30. A second end of the first parallel capacitive element CPF is coupled to a second end of the third parallel capacitive element CPR to receive the clock signal CLK. A second end of the second parallel capacitive element CPS is coupled to a second end of the fourth parallel capacitive element CPT to receive the inverting clock signal NCLK.

FIGS. 2A, 2B, 2C, and 2D are graphs illustrating timing relationships between the clock signal CLK, the inverting clock signal NCLK, the beta control signal BCS, and the alpha control signal ACS illustrated in FIG. 1, respectively, according to the prior art. The beta control signal BCS is nominally phase-aligned with the clock signal CLK and the alpha control signal ACS is nominally phase-aligned with the inverting clock signal NCLK.

Figure 2:
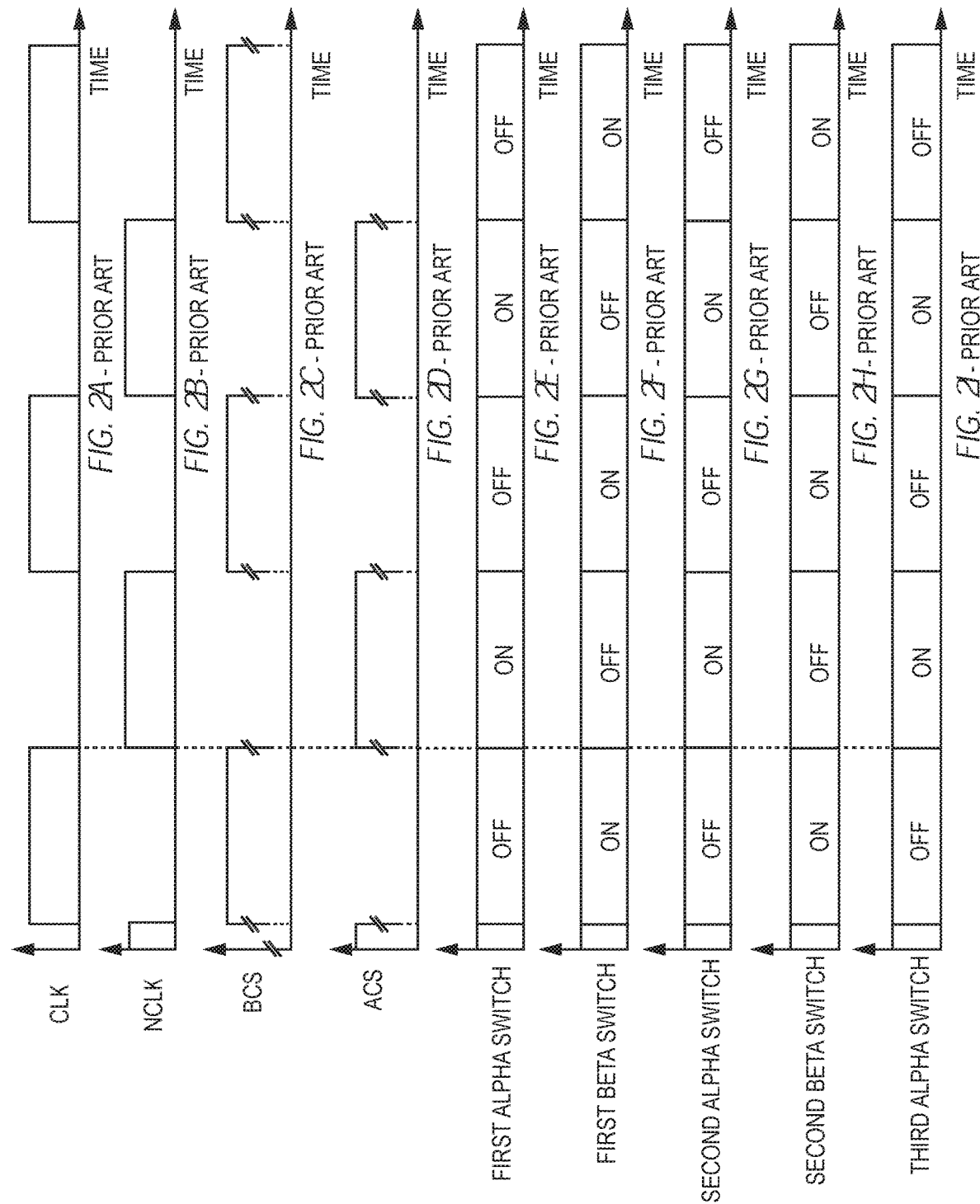
FIGS. 2F and 2H are graphs illustrating a status of a first beta switching element and a second beta switching element, respectively, with respect to the beta control signal, according to the prior art.

FIGS. 2E, 2G, and 2I are graphs illustrating a status of the first alpha switching element 22, the second alpha switching element 26, and the third alpha switching element 30 illustrated in FIG. 1, respectively, as controlled by the alpha control signal ACS, according to the prior art. When the alpha control signal ACS is a logic HIGH, each of the group of alpha switching elements 22, 26, 30 is ON. Conversely, when the alpha control signal ACS is a logic LOW, each of the group of alpha switching elements 22, 26, 30 is OFF.

FIGS. 2F and 2H are graphs illustrating a status of the first beta switching element 24 and the second beta switching element 28 illustrated in FIG. 1, respectively, as controlled by the beta control signal BCS, according to the prior art. When the beta control signal BCS is a logic HIGH, each of the group of beta switching elements 24, 28 is ON. Conversely, when the beta control signal BCS is a logic LOW, each of the group of beta switching elements 24, 28 is OFF.

Figure 3:
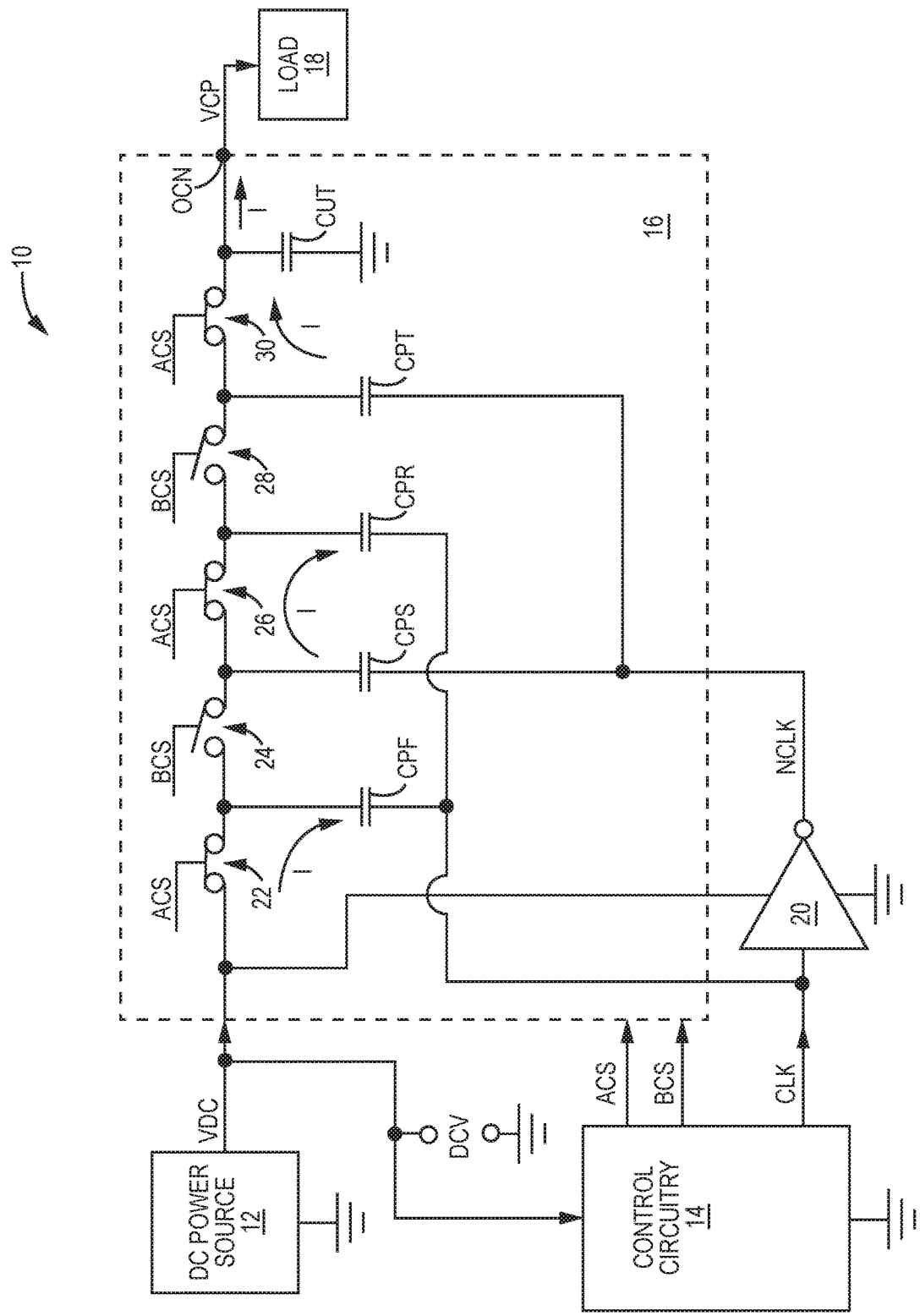
FIG. 3 shows the electrical apparatus illustrated in FIG. 1 when each of the first alpha switching element, the second alpha switching element, and the third alpha switching element is ON according to the prior art.

FIG. 3 shows the electrical apparatus 10 illustrated in FIG. 1 when each of the first alpha switching element 22, the second alpha switching element 26, and the third alpha switching element 30 is ON, and when each of the first beta switching element 24 and the second beta switching element 28 is OFF according to the prior art. In this regard, the clock signal CLK is a logic LOW and the inverting clock signal NCLK is a logic HIGH, such that the second ends of the first parallel capacitive element CPF and the third parallel capacitive element CPR are a logic LOW, and the second ends of the second parallel capacitive element CPS and the fourth parallel capacitive element CPT are a logic HIGH.

As a result, when the alpha switching elements 22, 26, 30 are ON, the first parallel capacitive element CPF receives a charging current I from the DC power source 12 via the first alpha switching element 22; the third parallel capacitive element CPR receives a charging current I from the second parallel capacitive element CPS via the second alpha switching element 26; and the output capacitive element CUT and the load 18 receive a charging current I from the fourth parallel capacitive element CPT via the third alpha switching element 30.

In this regard, when the alpha switching elements 22, 26, 30 are ON, since the second end of the first parallel capacitive element CPF is a logic LOW, a maximum voltage across the first parallel capacitive element CPF is equal to the DC source voltage DCV. In addition, since the second end of the third parallel capacitive element CPR is LOW and the second end of the second parallel capacitive element CPS is HIGH, a maximum voltage across the third parallel capacitive element CPR is equal to a sum of the DC source voltage DCV and a maximum voltage across the second parallel capacitive element CPS. Further, since the second end of the fourth parallel capacitive element CPT is HIGH, a maximum voltage across the output capacitive element CUT is equal to a sum of the DC source voltage DCV and a maximum voltage across the fourth parallel capacitive element CPT.

Since the first beta switching element 24 is OFF and the second beta switching element 28 is OFF, the first parallel capacitive element CPF is isolated from the second parallel capacitive element CPS and the third parallel capacitive element CPR is isolated from the fourth parallel capacitive element CPT.

Figure 4:
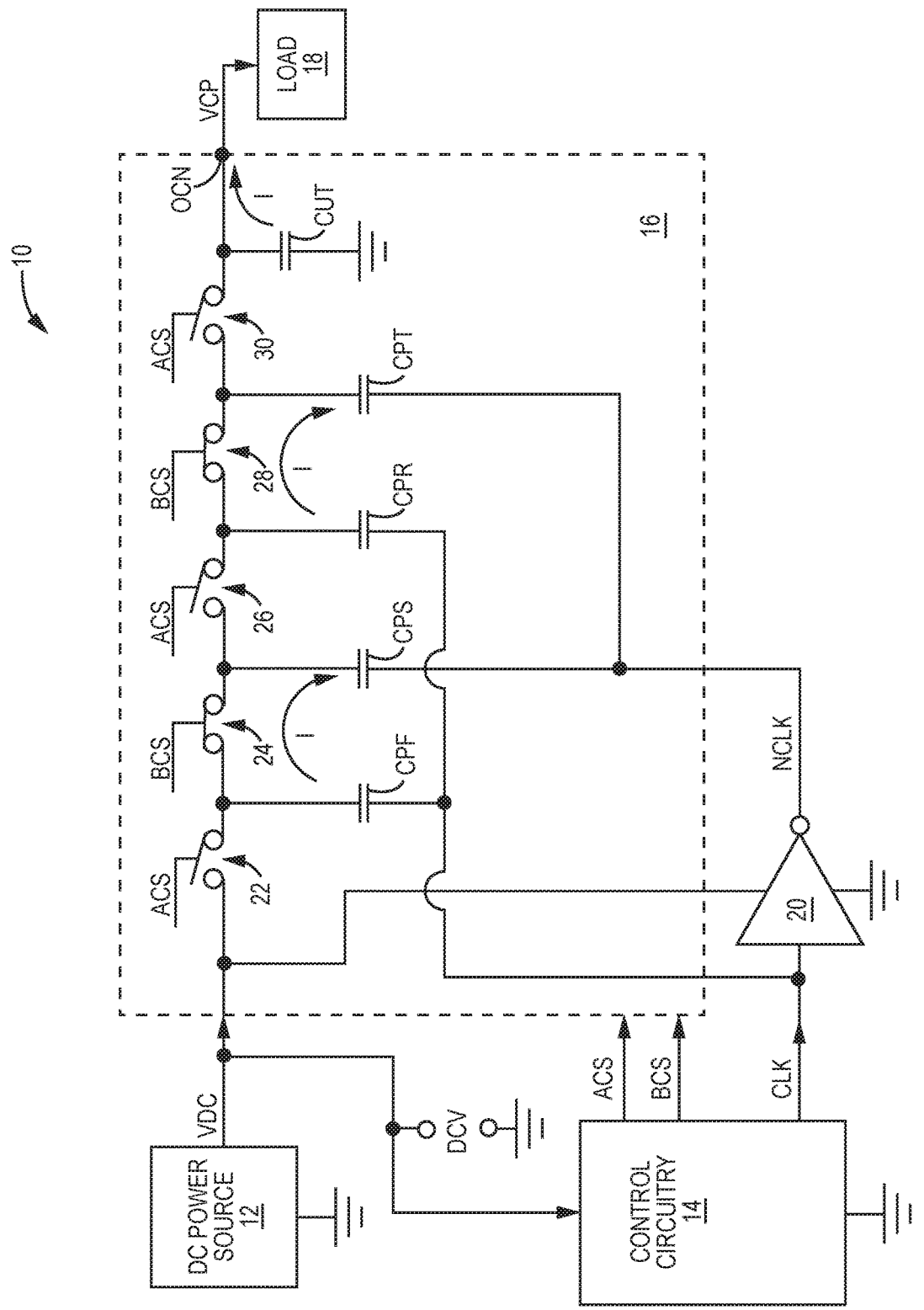
FIG. 4 shows the electrical apparatus illustrated in FIG. 1 when each of the first beta switching element and the second beta switching element is ON according to the prior art.

FIG. 4 shows the electrical apparatus 10 illustrated in FIG. 1 when each of the first alpha switching element 22, the second alpha switching element 26, and the third alpha switching element 30 is OFF, and when each of the first beta switching element 24 and the second beta switching element 28 is ON according to the prior art. In this regard, the clock signal CLK is a logic HIGH and the inverting clock signal NCLK is a logic LOW, such that the second ends of the first parallel capacitive element CPF and the third parallel capacitive element CPR are a logic HIGH, and the second ends of the second parallel capacitive element CPS and the fourth parallel capacitive element CPT are a logic LOW.

In this regard, the second parallel capacitive element CPS receives a charging current I from the first parallel capacitive element CPF via the first beta switching element 24. The fourth parallel capacitive element CPT receives a charging current I from the third parallel capacitive element CPR via the second beta switching element 28. Since the third alpha switching element 30 is OFF, the output capacitive element CUT provides an output current I to the load 18.

Since the clock signal CLK is a logic HIGH, and since the inverting clock signal NCLK is a logic LOW, the maximum voltage across the second parallel capacitive element CPS is equal to a sum of the DC source voltage DCV and the maximum voltage across the first parallel capacitive element CPF. However, since the maximum voltage across the first parallel capacitive element CPF is equal to the DC source voltage DCV, the maximum voltage across the second parallel capacitive element CPS is equal to two times the DC source voltage DCV.

Since the clock signal CLK is a logic HIGH, and since the inverting clock signal NCLK is a logic LOW, the maximum voltage across the fourth parallel capacitive element CPT is equal to a sum of the DC source voltage DCV and the maximum voltage across the third parallel capacitive element CPR. However, the maximum voltage across the third parallel capacitive element CPR is equal to a sum of the DC source voltage DCV and a maximum voltage across the second parallel capacitive element CPS, which is equal to two times the DC source voltage DCV. Therefore, the maximum voltage across the third parallel capacitive element CPR is equal to three times the DC source voltage DCV. As such, the maximum voltage across the fourth parallel capacitive element CPT is equal to four times the DC source voltage DCV.

Since the maximum voltage across the output capacitive element CUT is equal to a sum of the DC source voltage DCV and the maximum voltage across the fourth parallel capacitive element CPT, the maximum voltage across the output capacitive element CUT is equal to five times the DC source voltage DCV. In addition, since the third alpha switching element 30 is OFF, the output capacitive element CUT provides the current I to the load 18.

Figure 5:
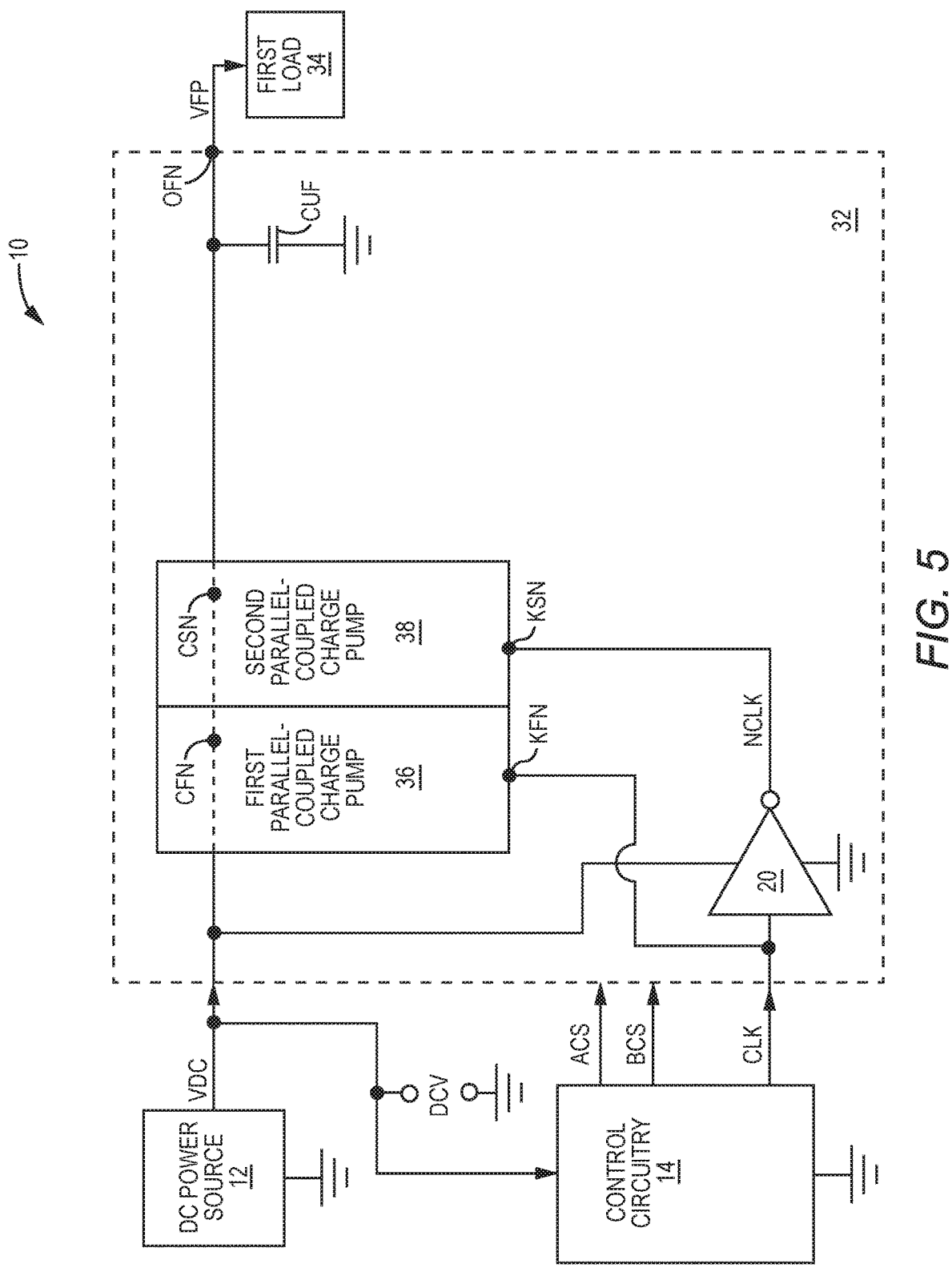
FIG. 5 shows an electrical apparatus according to one embodiment of the present disclosure.

FIG. 5 shows an electrical apparatus 10 according to one embodiment of the present disclosure. The electrical apparatus 10 includes a DC power source 12, control circuitry 14, a two dimensional charge pump 32, and a first load 34. The DC power source 12 provides a DC source signal VDC to the control circuitry 14 and the two dimensional charge pump 32. The DC source signal VDC has a DC source voltage DCV.

The two dimensional charge pump 32 has a first output connection node OFN, which is coupled to the first load 34. In one embodiment of the electrical apparatus 10, the two dimensional charge pump 32 provides a first charge pump output voltage VFP to the first load 34 via the first output connection node OFN using the DC source signal VDC. The control circuitry 14 provides an alpha control signal ACS, a beta control signal BCS, and a clock signal CLK to the two dimensional charge pump 32.

In one embodiment of the two dimensional charge pump 32, the two dimensional charge pump 32 includes a clock inverter 20, a first parallel-coupled charge pump 36, a second parallel-coupled charge pump 38, and a first output capacitive element CUF. The first output capacitive element CUF is coupled between the first output connection node OFN and ground. The clock inverter 20 inverts the clock signal CLK to provide an inverting clock signal NCLK, such that the inverting clock signal NCLK is phase-shifted from the clock signal CLK by nominally 180 degrees.

In one embodiment of the two dimensional charge pump 32, the first parallel-coupled charge pump 36 has a first charge pump connection node CFN and a first clock connection node KFN. The second parallel-coupled charge pump 38 has a second charge pump connection node CSN and a second clock connection node KSN. In general, in one embodiment of the two dimensional charge pump 32, the two dimensional charge pump 32 includes a group of parallel-coupled charge pumps 36, 38 having a corresponding group of charge pump connection nodes CFN, CSN and a corresponding group of clock connection nodes KFN, KSN. The group of parallel-coupled charge pumps 36, 38 is coupled between the DC power source 12 and the first output connection node OFN via the corresponding group of charge pump connection nodes CFN, CSN. The two dimensional charge pump 32 provides the first charge pump output voltage VFP via the first output connection node OFN using the DC power source 12 and the group of parallel-coupled charge pumps 36, 38.

In one embodiment of the two dimensional charge pump 32, the first parallel-coupled charge pump 36 is coupled between the DC power source 12 and the second parallel-coupled charge pump 38. The first parallel-coupled charge pump 36 receives the clock signal CLK via the first clock connection node KFN. The second parallel-coupled charge pump 38 receives the inverting clock signal NCLK via the second clock connection node KSN. In one embodiment of the two dimensional charge pump 32, the first parallel-coupled charge pump 36 uses the clock signal CLK to partially provide the first charge pump output voltage VFP. In one embodiment of the two dimensional charge pump 32, the second parallel-coupled charge pump 38 uses the inverting clock signal NCLK to partially provide the first charge pump output voltage VFP.

In one embodiment of the DC power source 12, the DC power source 12 is a battery, a group of batteries, a solar cell, a group of solar cells, a DC power supply, a suitable energy harvesting source, the like, or any combination thereof.

FIG. 6 shows the electrical apparatus 10 according to an alternate embodiment of the electrical apparatus 10. The electrical apparatus 10 illustrated in FIG. 6 is similar to the electrical apparatus 10 illustrated in FIG. 5, except the electrical apparatus 10 illustrated in FIG. 6 further includes a second load 40. In addition, the clock inverter 20 is omitted from the two dimensional charge pump 32, such that the control circuitry 14 provides both the clock signal CLK and the inverting clock signal NCLK to the two dimensional charge pump 32. However, the two dimensional charge pump 32 further has a second output connection node OSN and a second output capacitive element CUS coupled between the second output connection node OSN and ground.

In one embodiment of the electrical apparatus 10, the two dimensional charge pump 32 further provides a second charge pump output voltage VSP to the second load 40 via the second output connection node OSN using the DC source signal VDC. The group of parallel-coupled charge pumps 36, 38 is coupled between the DC power source 12 and the second output connection node OSN. The two dimensional charge pump 32 provides the second charge pump output voltage VSP via the second output connection node OSN using the DC power source 12 and the group of parallel-coupled charge pumps 36, 38. In general, in one embodiment of the two dimensional charge pump 32, the two dimensional charge pump 32 has a group of output connection nodes OFN, OSN and provides a group of charge pump output voltages VFP, VSP via the corresponding group of output connection nodes OFN, OSN.

Figure 7:
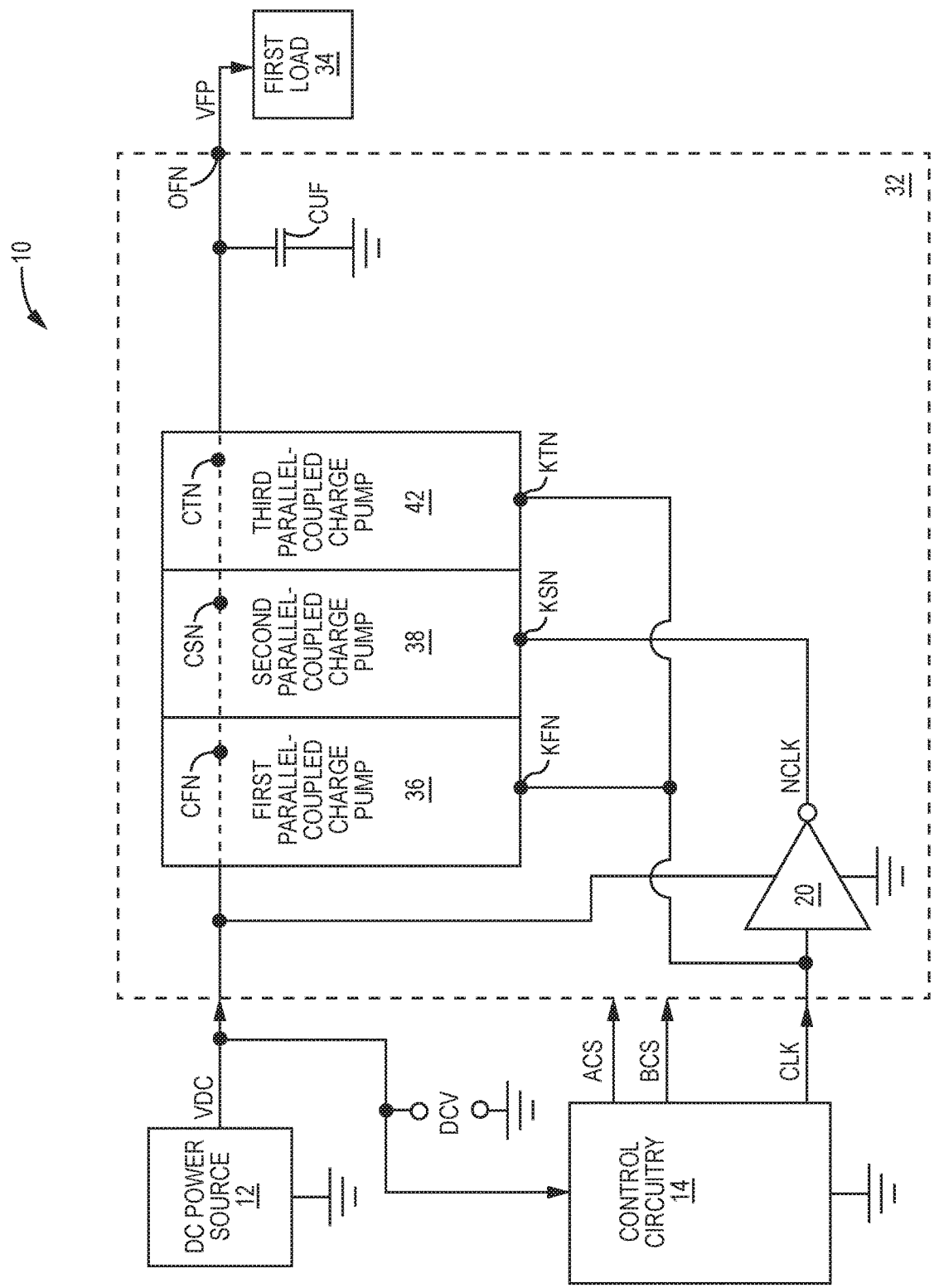
FIG. 7 shows the electrical apparatus according to an additional embodiment of the electrical apparatus.

FIG. 7 shows the electrical apparatus 10 according to an additional embodiment of the electrical apparatus 10. The electrical apparatus 10 illustrated in FIG. 7 is similar to the electrical apparatus 10 illustrated in FIG. 5, except in the electrical apparatus 10 illustrated in FIG. 7, the two dimensional charge pump 32 further includes a third parallel-coupled charge pump 42 having a third charge pump connection node CTN and a third clock connection node KTN, which receives the clock signal CLK. In this regard, the two dimensional charge pump 32 illustrated in FIG. 7 includes a group of parallel-coupled charge pumps 36, 38, 42 having a corresponding group of charge pump connection nodes CFN, CSN, CTN and a corresponding group of clock connection nodes KFN, KSN, KTN. In one embodiment of the two dimensional charge pump 32, odd numbered of the group of clock connection nodes KFN, KSN, KTN, such as the first clock connection node KFN and the third clock connection node KTN, receive the clock signal CLK, whereas even numbered of the group of clock connection nodes KFN, KSN, KTN, such as the second clock connection node KSN, receive the inverting clock signal NCLK.

Figure 8:
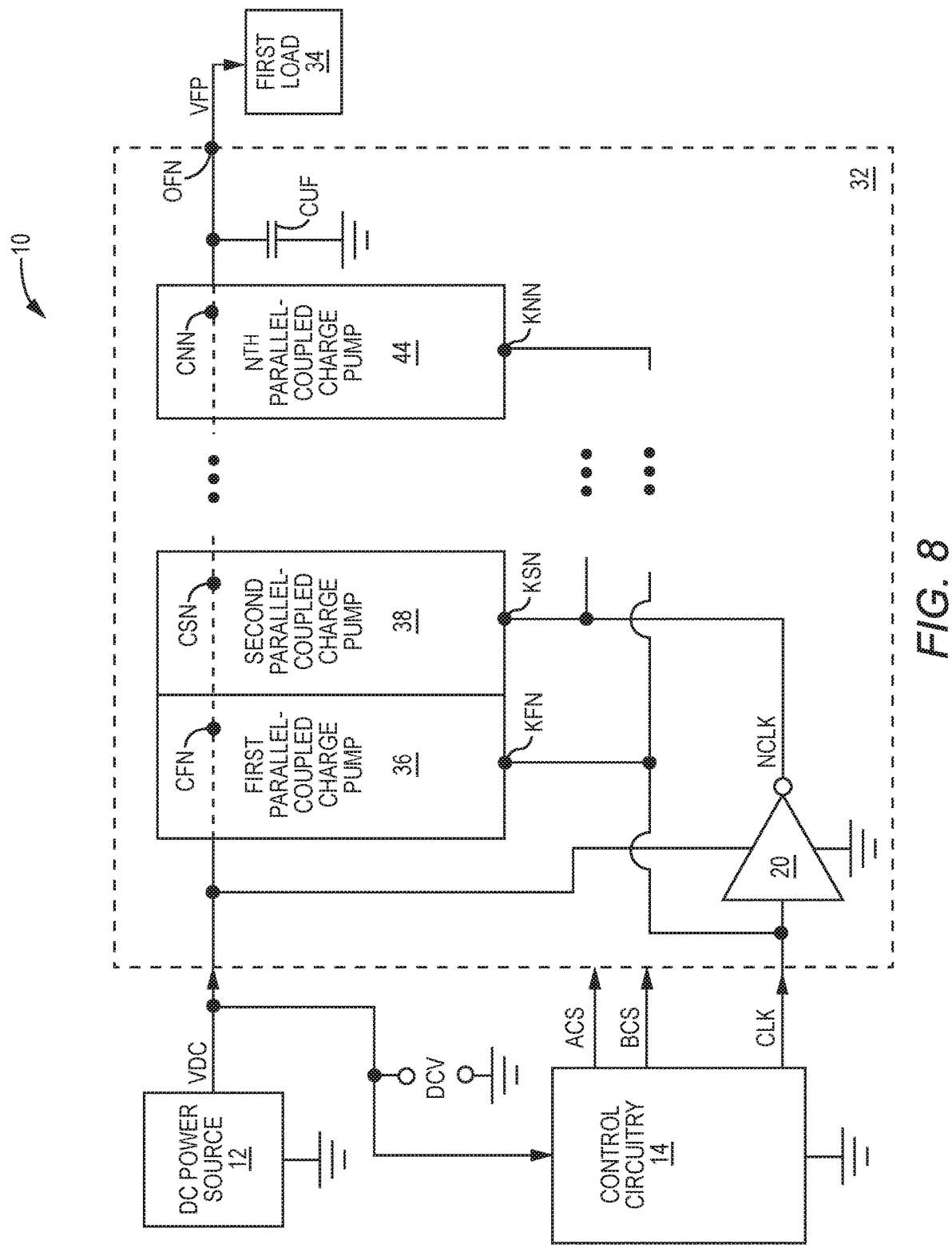
FIG. 8 shows the electrical apparatus according to another embodiment of the electrical apparatus.

FIG. 8 shows the electrical apparatus 10 according to another embodiment of the electrical apparatus 10. The electrical apparatus 10 illustrated in FIG. 8 is similar to the electrical apparatus 10 illustrated in FIG. 5, except in the electrical apparatus 10 illustrated in FIG. 8, the two dimensional charge pump 32 further includes up to and including an $N^{TH}$ parallel-coupled charge pump 44 having an $N^{TH}$ charge pump connection node CNN and an $N^{TH}$ clock connection node KNN. In this regard, the two dimensional charge pump 32 illustrated in FIG. 8 includes a group of parallel-coupled charge pumps 36, 38, 44 having a corresponding group of charge pump connection nodes CFN, CSN, CNN and a corresponding group of clock connection nodes KFN, KSN, KNN.

Figure 9:
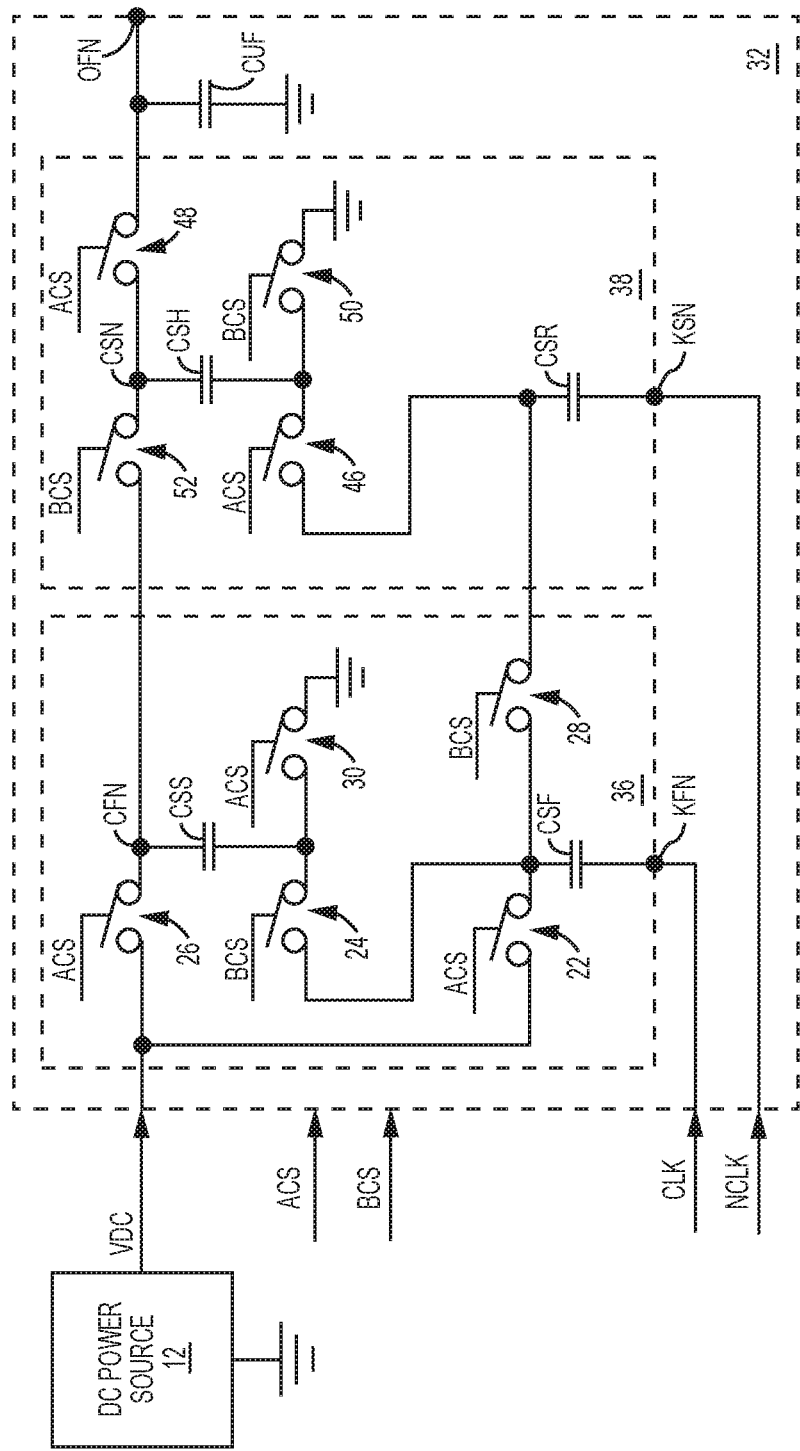
FIG. 9 shows details of a two dimensional charge pump illustrated in FIG. 5 according to one embodiment of the two dimensional charge pump.

FIG. 9 shows details of a two dimensional charge pump 32 illustrated in FIG. 5 according to one embodiment of the two dimensional charge pump 32. The two dimensional charge pump 32 illustrated in FIG. 9 is similar to the two dimensional charge pump 32 illustrated in FIG. 5, except in the two dimensional charge pump 32 illustrated in FIG. 9, details of the first parallel-coupled charge pump 36 and the second parallel-coupled charge pump 38 are shown, and the control circuitry 14 is omitted.

The first parallel-coupled charge pump 36 includes a first alpha switching element 22, a first beta switching element 24, a second alpha switching element 26, a second beta switching element 28, a third alpha switching element 30, a first series capacitive element CSF, and a second series capacitive element CSS. The first series capacitive element CSF is coupled between the first clock connection node KFN and the first beta switching element 24. The second series capacitive element CSS is coupled between the first charge pump connection node CFN and the first beta switching element 24. The third alpha switching element 30 is coupled between the second series capacitive element CSS and ground. The first alpha switching element 22 is coupled between the DC power source 12 and the first series capacitive element CSF. The second alpha switching element 26 is coupled between the DC power source 12 and the first charge pump connection node CFN. The second beta switching element 28 is coupled between the first series capacitive element CSF and the second parallel-coupled charge pump 38. The third series capacitive element CSR is coupled between the second beta switching element 28 and the second clock connection node KSN.

A first group of series capacitive elements CSF, CSS includes the first series capacitive element CSF and the second series capacitive element CSS. The first group of series capacitive elements CSF, CSS is coupled between the first charge pump connection node CFN and the first clock connection node KFN.

The second parallel-coupled charge pump 38 includes a fourth alpha switching element 46, a fifth alpha switching element 48, a third beta switching element 50, a fourth beta switching element 52, a third series capacitive element CSR, and a fourth series capacitive element CSH. A second group of series capacitive elements CSR, CSH includes the third series capacitive element CSR and the fourth series capacitive element CSH. The second group of series capacitive elements CSR, CSH is coupled between the second charge pump connection node CSN and the second clock connection node KSN.

The first series capacitive element CSF, the second series capacitive element CSS, and the first beta switching element 24 are coupled in series between the first charge pump connection node CFN and the first clock connection node KFN. The second alpha switching element 26, the second series capacitive element CSS, and the third alpha switching element 30 are coupled in series between the DC power source 12 and ground. The first alpha switching element 22 and the first series capacitive element CSF are coupled in series between the DC power source 12 and the first clock connection node KFN.

The third series capacitive element CSR, the fourth series capacitive element CSH, and the fourth alpha switching element 46 are coupled in series between the second charge pump connection node CSN and the second clock connection node KSN. The fourth beta switching element 52, the fourth series capacitive element CSH, and the third beta switching element 50 are coupled in series between the first charge pump connection node CFN and ground. The second beta switching element 28 and the third series capacitive element CSR are coupled in series between the first series capacitive element CSF and the second clock connection node KSN. The fifth alpha switching element 48 is coupled in series between the second charge pump connection node CSN and the first output connection node OFN.

In general, in one embodiment of the two dimensional charge pump 32, each of the group of parallel-coupled charge pumps 36, 38 has a corresponding group of series capacitive elements CSF, CSS, CSR, CSH coupled between a corresponding one of the group of charge pump connection nodes CFN, CSN and a corresponding one of the group of clock connection nodes KFN, KSN.

FIG. 10 shows details of the two dimensional charge pump 32 illustrated in FIG. 6 without the control circuitry 14 according to one embodiment of the two dimensional charge pump 32. The first parallel-coupled charge pump 36 and the second parallel-coupled charge pump 38 illustrated in FIG. 10 are similar to the first parallel-coupled charge pump 36 and the second parallel-coupled charge pump 38 illustrated in FIG. 9, except the second parallel-coupled charge pump 38 illustrated in FIG. 10 further includes a sixth alpha switching element 54 coupled between the first parallel-coupled charge pump 36 and the second output connection node OSN.

In general, the two dimensional charge pump 32 illustrated in FIG. 10 includes a group of alpha switching elements 22, 26, 30, 46, 48, 54, and a group of beta switching elements 24, 28, 50, 52.

FIGS. 11A, 11B, 11C, and 11D are graphs illustrating timing relationships between the clock signal CLK, the inverting clock signal NCLK, the beta control signal BCS, and the alpha control signal ACS, respectively, according to one embodiment of the two dimensional charge pump 32 illustrated in FIG. 10. The beta control signal BCS is nominally phase-aligned with the clock signal CLK and the alpha control signal ACS is nominally phase-aligned with the inverting clock signal NCLK. FIGS. 11E, 11G, and 11I are graphs illustrating a status of the first alpha switching element 22, the second alpha switching element 26, and the third alpha switching element 30 with respect to the alpha control signal ACS, according to one embodiment of the two dimensional charge pump 32 illustrated in FIG. 10. FIGS. 11F and 11H are graphs illustrating a status of the first beta switching element 24 and the second beta switching element 28, respectively, with respect to the beta control signal BCS, according to one embodiment of the two dimensional charge pump 32 illustrated in FIG. 10.

FIGS. 12A, 12B, 12C, and 12D are graphs illustrating timing relationships between the clock signal CLK, the inverting clock signal NCLK, the beta control signal BCS, and the alpha control signal ACS, respectively, according to one embodiment of the two dimensional charge pump 32 illustrated in FIG. 10. FIGS. 12E, 12G, and 12I are graphs illustrating a status of the fourth alpha switching element 46, the fifth alpha switching element 48, and the sixth alpha switching element 54 with respect to the alpha control signal ACS, according to one embodiment of the two dimensional charge pump 32 illustrated in FIG. 10. FIGS. 12F and 12H are graphs illustrating a status of the third beta switching element 50 and the fourth beta switching element 52, respectively, with respect to the beta control signal BCS, according to one embodiment of the two dimensional charge pump 32 illustrated in FIG. 10.

FIG. 13 shows details of the two dimensional charge pump 32 illustrated in FIG. 10 during an alpha operating mode according to one embodiment of the two dimensional charge pump 32. During the alpha operating mode, the first alpha switching element 22 is ON, the second alpha switching element 26 is ON, the third alpha switching element 30 is ON, the fourth alpha switching element 46 is ON, the fifth alpha switching element 48 is ON, the sixth alpha switching element 54 is ON, the first beta switching element 24 is OFF, the second beta switching element 28 is OFF, the third beta switching element 50 is OFF, and the fourth beta switching element 52 is OFF.

In this regard, during the alpha operating mode, the first series capacitive element CSF is charged via the DC power source 12, the first alpha switching element 22, and the first clock connection node KFN, such that the first series capacitive element CSF receives a charging current I. Further, during the alpha operating mode, the second series capacitive element CSS is charged via the DC power source 12, the second alpha switching element 26, and the third alpha switching element 30.

FIG. 14 shows details of the two dimensional charge pump 32 illustrated in FIG. 10 during a beta operating mode according to one embodiment of the two dimensional charge pump 32. During the beta operating mode, the clock signal CLK is HIGH, the first alpha switching element 22 is OFF, the first beta switching element 24 is ON, the second alpha switching element 26 is OFF, the second beta switching element 28 is ON, the third beta switching element 50 is ON, the fourth beta switching element 52 is ON, the fourth alpha switching element 46 is OFF, the fifth alpha switching element 48 is OFF, the sixth alpha switching element 54 is OFF, and the third alpha switching element 30 is OFF, such that the first series capacitive element CSF and the second series capacitive element CSS are discharged via the first clock connection node KFN, the first beta switching element 24, and the first charge pump connection node CFN.

FIG. 15 shows details of the two dimensional charge pump 32 illustrated in FIG. 6 according to one embodiment of the two dimensional charge pump 32. The two dimensional charge pump 32 illustrated in FIG. 15 is similar to the two dimensional charge pump 32 illustrated in FIG. 6, except in the two dimensional charge pump 32 illustrated in FIG. 15, the first parallel-coupled charge pump 36 and the second parallel-coupled charge pump 38 include additional circuitry.

In this regard, the first parallel-coupled charge pump 36 further includes an $N^{TH}$ charge pump connection node CNN, a fifth beta switching element 56, a seventh alpha switching element 58, an eighth alpha switching element 60, and an $N^{TH}$ series capacitive element CNS. The second parallel-coupled charge pump 38 further includes a $P^{TH}$ charge pump connection node CNP, a sixth beta switching element 62, a seventh beta switching element 64, a ninth alpha switching element 66, a tenth alpha switching element 68, and a $P^{TH}$ series capacitive element CSP.

The first series capacitive element CSF is coupled between the first clock connection node KFN and the first beta switching element 24. The second series capacitive element CSS is coupled between the first charge pump connection node CFN and the first beta switching element 24. The third alpha switching element 30 is coupled between the second series capacitive element CSS and ground. The first alpha switching element 22 is coupled between the DC power source 12 and the first series capacitive element CSF. The second alpha switching element 26 is coupled between the DC power source 12 and the first charge pump connection node CFN. The second beta switching element 28 is coupled between the first series capacitive element CSF and the second parallel-coupled charge pump 38. The third series capacitive element CSR is coupled between the second beta switching element 28 and the second clock connection node KSN.

A first group of series capacitive elements CSF, CSS includes the first series capacitive element CSF and the second series capacitive element CSS. The first group of series capacitive elements CSF, CSS is coupled between the first charge pump connection node CFN and the first clock connection node KFN.

The second parallel-coupled charge pump 38 includes a fourth alpha switching element 46, a fifth alpha switching element 48, a third beta switching element 50, a fourth beta switching element 52, a third series capacitive element CSR, and a fourth series capacitive element CSH. A second group of series capacitive elements CSR, CSH includes the third series capacitive element CSR and the fourth series capacitive element CSH. The second group of series capacitive elements CSR, CSH is coupled between the second charge pump connection node CSN and the second clock connection node KSN.

The first series capacitive element CSF, the second series capacitive element CSS, and the first beta switching element 24 are coupled in series between the first charge pump connection node CFN and the first clock connection node KFN. The second alpha switching element 26, the second series capacitive element CSS, and the third alpha switching element 30 are coupled in series between the DC power source 12 and ground. The first alpha switching element 22 and the first series capacitive element CSF are coupled in series between the DC power source 12 and the first clock connection node KFN.

The third series capacitive element CSR, the fourth series capacitive element CSH, and the fourth alpha switching element 46 are coupled in series between the second charge pump connection node CSN and the second clock connection node KSN. The fourth beta switching element 52, the fourth series capacitive element CSH, and the third beta switching element 50 are coupled in series between the first charge pump connection node CFN and ground. The second beta switching element 28 and the third series capacitive element CSR are coupled in series between the first series capacitive element CSF and the second clock connection node KSN. The fifth alpha switching element 48 is coupled in series between the second charge pump connection node CSN and the first output connection node OFN.

In general, in one embodiment of the two dimensional charge pump 32, each of the group of parallel-coupled charge pumps 36, 38 has a corresponding group of series capacitive elements CSF, CSS, CNN, CSR, CSH, CSP coupled between a corresponding one of the group of charge pump connection nodes CFN, CSN, CNN, CNP and a corresponding one of the group of clock connection nodes KFN, KSN.

FIG. 16 shows the electrical apparatus 10 according to one embodiment of the electrical apparatus 10. The electrical apparatus 10 includes the DC power source 12, the control circuitry 14, and the two dimensional charge pump 32. The control circuitry 14 provides the alpha control signal ACS, the beta control signal BCS, the clock signal CLK, and the inverting clock signal NCLK to the two dimensional charge pump 32. In an alternate embodiment of the electrical apparatus 10, the two dimensional charge pump 32 provides the inverting clock signal NCLK internally using the clock signal CLK, such that the control circuitry 14 does not provide the inverting clock signal NCLK. In one embodiment of the electrical apparatus 10, the DC power source 12 provides the DC source signal VDC to the control circuitry 14 and the two dimensional charge pump 32. In one embodiment of the electrical apparatus 10, the two dimensional charge pump 32 provides the first charge pump output voltage VFP to the control circuitry 14.

The two dimensional charge pump 32 provides the first charge pump output voltage VFP to the control circuitry 14 using the alpha control signal ACS, the beta control signal BCS, the clock signal CLK, and the inverting clock signal NCLK. In one embodiment of the control circuitry 14, the control circuitry 14 includes flash memory 70. In one embodiment of the electrical apparatus 10, the first charge pump output voltage VFP provides a programming voltage for the flash memory 70.

Those skilled in the art will recognize improvements and modifications to the preferred embodiments of the present disclosure. All such improvements and modifications are considered within the scope of the concepts disclosed herein and the claims that follow.

What is claimed is:
1. An electrical apparatus comprising:
control circuitry configured to provide a clock signal; and
a two dimensional charge pump comprising a plurality of parallel-coupled charge pumps coupled between a DC power source and a first output connection node via a corresponding plurality of charge pump connection nodes, wherein:
the plurality of parallel-coupled charge pumps is further coupled between the DC power source and a second output connection node;
the plurality of parallel-coupled charge pumps has a corresponding plurality of clock connection nodes;
each of the plurality of parallel-coupled charge pumps comprises a corresponding plurality of series capacitive elements coupled between a corresponding one of the plurality of charge pump connection nodes and a corresponding one of the plurality of clock connection nodes;

the two dimensional charge pump further comprises a first output capacitive element and a second output capacitive element, such that the first output capacitive element is coupled between the first output connection node and ground and the second output capacitive element is coupled between the second output connection node and ground; and the two dimensional charge pump is configured to provide a first charge pump output voltage via the first output connection node and a second charge pump output voltage via the second output connection node using the DC power source and the plurality of parallel-coupled charge pumps.

2. The electrical apparatus of claim 1 wherein:

the plurality of parallel-coupled charge pumps further comprises a first parallel-coupled charge pump and a second parallel-coupled charge pump;

the first parallel-coupled charge pump is coupled between the DC power source and the second parallel-coupled charge pump;

the plurality of clock connection nodes has a first clock connection node and a second clock connection node, and the plurality of charge pump connection nodes has a first charge pump connection node and a second charge pump connection node; and the first parallel-coupled charge pump has the first charge pump connection node and the second parallel-coupled charge pump has the second charge pump connection node.

3. The electrical apparatus of claim 2 wherein:

the first parallel-coupled charge pump comprises a first plurality of series capacitive elements coupled between the first charge pump connection node and the first clock connection node, such that the first plurality of series capacitive elements comprises a first series capacitive element and a second series capacitive element; and the second parallel-coupled charge pump comprises a second plurality of series capacitive elements coupled between the second charge pump connection node and the second clock connection node, such that the second plurality of series capacitive elements comprises a third series capacitive element and a fourth series capacitive element.

4. The electrical apparatus of claim 2 wherein:

the first parallel-coupled charge pump is configured to receive a clock signal via the first clock connection node; and the second parallel-coupled charge pump is configured to receive an inverting clock signal via the second clock connection node.

5. The electrical apparatus of claim 4 wherein:

the first parallel-coupled charge pump is further configured to use the clock signal to partially provide the first charge pump output voltage; and the second parallel-coupled charge pump is further configured to use the inverting clock signal to partially provide the first charge pump output voltage, such that the inverting clock signal is phase-shifted from the clock signal by nominally 180 degrees.

6. The electrical apparatus of claim 4 further comprising control circuitry configured to provide the clock signal and the inverting clock signal.

7. The electrical apparatus of claim 4 further comprising control circuitry configured to provide the clock signal, wherein the two dimensional charge pump comprises a clock inverter configured to invert the clock signal to provide the inverting clock signal.

8. The electrical apparatus of claim 4 wherein the first parallel-coupled charge pump comprises a first alpha switching element, a first beta switching element, a second alpha switching element, a third alpha switching element, a first series capacitive element, and a second series capacitive element, such that:

the first series capacitive element is coupled between the first clock connection node and the first beta switching element;

the second series capacitive element is coupled between the first charge pump connection node and the first beta switching element;

the third alpha switching element is coupled between the second series capacitive element and ground;

the first alpha switching element is coupled between the DC power source and the first series capacitive element; and the second alpha switching element is coupled between the DC power source and the first charge pump connection node.

9. The electrical apparatus of claim 8 wherein when the clock signal is LOW:

the first alpha switching element is configured to be ON;
the first beta switching element is configured to be OFF;
the second alpha switching element is configured to be ON; and
the third alpha switching element is configured to be ON, wherein:
  the first series capacitive element is configured to be charged via the DC power source, the first alpha switching element, and the first clock connection node; and
  the second series capacitive element is configured to be charged via the DC power source, the second alpha switching element, and the third alpha switching element.

10. The electrical apparatus of claim 8 wherein when the clock signal is HIGH:

the first alpha switching element is configured to be OFF;
the first beta switching element is configured to be ON;
the second alpha switching element is configured to be OFF; and
the third alpha switching element is configured to be OFF, wherein the first series capacitive element and the second series capacitive element are configured to be discharged via the first clock connection node, the first beta switching element, the first charge pump connection node, and the second parallel-coupled charge pump.

11. The electrical apparatus of claim 8 wherein the first parallel-coupled charge pump further comprises a second beta switching element and the second parallel-coupled charge pump comprises a third series capacitive element, such that:

the second beta switching element is coupled between the first series capacitive element and the second parallel-coupled charge pump; and the third series capacitive element is coupled between the second beta switching element and the second clock connection node.

12. The electrical apparatus of claim 11 wherein when the clock signal is LOW:
the first alpha switching element is configured to be ON;
the first beta switching element is configured to be OFF;
the second alpha switching element is configured to be ON;
the second beta switching element is configured to be OFF; and
the third alpha switching element is configured to be ON, wherein:
the first series capacitive element is configured to be charged via the first alpha switching element and the first clock connection node; and
the second series capacitive element is configured to be charged via the second alpha switching element and the third alpha switching element.

13. The electrical apparatus of claim 11 wherein when the clock signal is HIGH:
the first alpha switching element is configured to be OFF;
the first beta switching element is configured to be ON;
the second alpha switching element is configured to be OFF; and
the third alpha switching element is configured to be OFF, wherein the first series capacitive element and the second series capacitive element are configured to be discharged via the first beta switching element and the first clock connection node.

14. The electrical apparatus of claim 1 wherein the DC power source is a battery.

15. The electrical apparatus of claim 1 wherein the two dimensional charge pump further comprises a first output capacitive element coupled between the first output connection node and ground.

16. The electrical apparatus of claim 1 further comprising flash memory, wherein the first charge pump output voltage is configured to provide a programming voltage for the flash memory.

17. The electrical apparatus of claim 1 wherein the two dimensional charge pump is further configured to provide a plurality of charge pump output voltages via a corresponding plurality of output connection nodes, such that the plurality of charge pump output voltages has the first charge pump output voltage and the plurality of output connection nodes has the first output connection node.

* * * * *